(12) United States Patent
Zhou et al.

(10) Patent No.: US 11,793,042 B2
(45) Date of Patent: Oct. 17, 2023

(54) DISPLAY PANEL AND FABRICATION METHOD THEREOF

(71) Applicant: Wuhan China Star Optoelectronics Semiconductor Display Technology Co., Ltd., Hubei (CN)

(72) Inventors: Jing Zhou, Hubei (CN); Yixian Zhang, Hubei (CN); Wenxu Xianyu, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 452 days.

(21) Appl. No.: 17/057,712

(22) PCT Filed: Jun. 23, 2020

(86) PCT No.: PCT/CN2020/097684
§ 371 (c)(1),
(2) Date: Nov. 23, 2020

(87) PCT Pub. No.: WO2021/223302
PCT Pub. Date: Nov. 11, 2021

(65) Prior Publication Data
US 2022/0140046 A1 May 5, 2022

(30) Foreign Application Priority Data
May 8, 2020 (CN) .......................... 202010382043.6

(51) Int. Cl.
*H10K 59/131* (2023.01)
*H10K 71/00* (2023.01)
(Continued)

(52) U.S. Cl.
CPC .......... *H10K 59/131* (2023.02); *H10K 71/00* (2023.02); *H10K 77/111* (2023.02); *H10K 59/1201* (2023.02); *H10K 2102/311* (2023.02)

(58) Field of Classification Search
None
See application file for complete search history.

(56) References Cited

U.S. PATENT DOCUMENTS

2014/0375916 A1* 12/2014 Chen .................. H01L 27/1218
349/33
2019/0271873 A1 9/2019 Yabuki
(Continued)

FOREIGN PATENT DOCUMENTS

CN 202816322 3/2013
CN 104992956 10/2015
(Continued)

OTHER PUBLICATIONS

Machine translation of CN-104992956 (Year: 2018).*
Machine translation of CN-110518054 (Year: 2021).*

*Primary Examiner* — J. E. Schoenholtz

(57) ABSTRACT

The present application provides a display panel and a fabrication method thereof. In the display panel, a bonding module covers a display area and an extension area, and a bonding conductive layer of the bonding module is electrically connected to an external driving chip. A display module covers the display area and the extension area, the display module comprises a thin film transistor array structure, and the thin film transistor array structure comprises a source-drain conductive layer. A portion of the source-drain conductive layer in the extension area is electrically connected to the bonding conductive layer by a through hole.

10 Claims, 4 Drawing Sheets

(51) Int. Cl.
   *H10K 77/10*     (2023.01)
   *H10K 59/12*     (2023.01)
   *H10K 102/00*    (2023.01)

(56) References Cited

U.S. PATENT DOCUMENTS

| | | | |
|---|---|---|---|
| 2020/0176547 A1* | 6/2020 | Seo | ............... H10K 59/12 |
| 2020/0312886 A1 | 10/2020 | Yuan et al. | |
| 2022/0140046 A1* | 5/2022 | Zhou | ............... H10K 77/111 |
| | | | 257/40 |

FOREIGN PATENT DOCUMENTS

| | | | | |
|---|---|---|---|---|
| CN | 107833978 | | 3/2018 | |
| CN | 108155220 | | 6/2018 | |
| CN | 207517684 | | 6/2018 | |
| CN | 104992956 B | * | 11/2018 | ............ G02F 1/13 |
| CN | 109872637 | | 6/2019 | |
| CN | 110010627 | | 7/2019 | |
| CN | 110034150 | | 7/2019 | |
| CN | 110310575 | | 10/2019 | |
| CN | 110518054 | | 11/2019 | |
| CN | 110518054 B | * | 12/2021 | ......... H01L 27/3244 |
| JP | 2002-040465 | | 2/2002 | |

* cited by examiner

DISPLAY PANEL AND FABRICATION METHOD THEREOF

RELATED APPLICATIONS

This application is a National Phase of PCT Patent Application No. PCT/CN2020/097684 having International filing date of Jun. 23, 2020, which claims the benefit of priority of Chinese Patent Application No. 202010382043.6 filed on May 8, 2020. The contents of the above applications are all incorporated by reference as if fully set forth herein in their entirety.

FIELD AND BACKGROUND OF THE INVENTION

The present application relates to a field of display technology, and more particularly to a display panel and a fabrication method thereof.

At present, a screen-to-body ratio of screens used in electronic products is increasing, and full screens have become a future trend. However, a bonding area of a display panel is usually bent to a backside surface of the display panel in display panels of existing electronic products, and a lower bezel of the display panel cannot be further narrowed due to an existing bending radius.

SUMMARY OF THE INVENTION

Embodiments of the present application provide a display panel and a fabrication method thereof to solve technical problems of insufficient bezel narrowing of existing display panels.

An embodiment of the present application provides a display panel including a display area and an extension area outside the display area, comprising:
 a bonding module covering the display area and the extension area, wherein the bonding module comprises a bonding conductive layer, and the bonding conductive layer is electrically connected to an external driving chip; and
 a display module covering the display area and the extension area, wherein the display module is disposed on the bonding module, the display module comprises a thin film transistor array structure, and the thin film transistor array structure comprises a source-drain conductive layer, wherein:
 a portion of the source-drain conductive layer in the extension area is electrically connected to the bonding conductive layer by a through hole.

In the display panel of the present embodiment, the bonding conductive layer comprises a plurality of fan-out traces and a plurality of bonding terminals, the plurality of fan-out traces are electrically connected to the source-drain conductive layer, the bonding terminals are connected to the fan-out traces, and the bonding terminals are electrically connected to the external driving chip.

In the display panel of the present embodiment, the bonding module further comprises a first substrate structure, the first substrate structure is disposed on the bonding conductive layer at a side away from the display module, an opening is formed in the first substrate structure, the opening corresponds to the plurality of bonding terminals, and the plurality of bonding terminals are exposed.

In the display panel of the present embodiment, the first substrate structure comprises a support layer and a first flexible substrate, and the first flexible substrate is disposed between the support layer and the bonding conductive layer.

In the display panel of the present embodiment, the display module further comprises a second substrate structure, and the second substrate structure is disposed between the bonding module and the thin film transistor array structure.

The thin film transistor array structure further comprises an active layer, a first insulating layer, a first gate conductive layer, a second insulating layer, a second gate conductive layer, a dielectric layer, and a planarization layer sequentially disposed on the second substrate structure, and the source-drain conductive layer is disposed between the dielectric layer and the planarization layer; and
 the through hole is formed in the extension area and is formed through the dielectric layer, the second insulating layer, the first insulating layer, and the second substrate structure, and is connected to the fan-out traces.

In the display panel of the present embodiment, the second substrate structure comprises a first barrier layer, a second flexible substrate, a second barrier layer, and a buffer layer sequentially disposed on the bonding conductive layer.

An embodiment of the present application provides a fabrication method of a display panel, comprising following steps:
 providing a substrate, wherein the substrate comprises a display area and an extension area outside the display area;
 forming a first flexible substrate on the substrate, wherein the first flexible substrate covers the display area and the extension area, and the bonding conductive layer is electrically connected to an external driving chip; and
 forming a bonding conductive layer on the substrate, wherein the bonding conductive layer covers the display area and the extension area, the display module comprises a thin film transistor array structure, the thin film transistor array structure comprises a source-drain conductive layer, and a portion of the source-drain conductive layer in the extension area is electrically connected to the bonding conductive layer through a through hole.

In the fabrication method of the present embodiment, the bonding conductive layer comprises a plurality of fan-out traces and a plurality of bonding terminals, the plurality of fan-out traces are electrically connected to the source-drain conductive layer, the bonding terminals are connected to the fan-out traces, and the bonding terminals are electrically connected to the external driving chip.

In the fabrication method of the present embodiment, forming the display module on the bonding conductive layer comprises following steps:
 forming a second substrate structure on the bonding conductive layer;
 sequentially forming an active layer, a first insulating layer, a first gate conductive layer, a second insulating layer, a second gate conductive layer, and a dielectric layer on the second substrate structure;
 performing a patterning treatment to a portion of the dielectric layer disposed in the extension area to form the through hole, and the through hole is formed through the dielectric layer, the second insulating layer, the first insulating layer, and the second substrate structure; and
 sequentially forming a source-drain conductive layer and a planarization layer on the dielectric layer, wherein a portion of the source-drain conductive layer fills the through hole to connect the fan-out traces.

In the fabrication method of the present embodiment, prior to forming of the bonding conductive layer on the substrate, further comprising a step of forming a first flexible substrate on the substrate; and prior to forming the display module on the bonding conductive layer, further comprising following steps:

peeling off the substrate;

adhering a support layer at a side of the first flexible substrate facing away from the display module, wherein the first flexible substrate and the support layer form a first substrate structure; and performing an opening process to an area of the first substrate structure corresponding to the plurality of bonding terminals to expose the plurality of bonding terminals.

In the display panel of the present application, a bonding module for bonding an external driving chip is disposed on a backside surface of the display module, and a source-drain conductive layer in the display module is electrically connected to a bonding conductive layer of the bonding module through a through hole, thereby saving plane space for disposing the bonding module and achieving effects of bezel narrowing.

BRIEF DESCRIPTION OF THE SEVERAL VIEWS OF THE DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DESCRIPTION OF SPECIFIC EMBODIMENTS OF THE INVENTION

Figure 1:
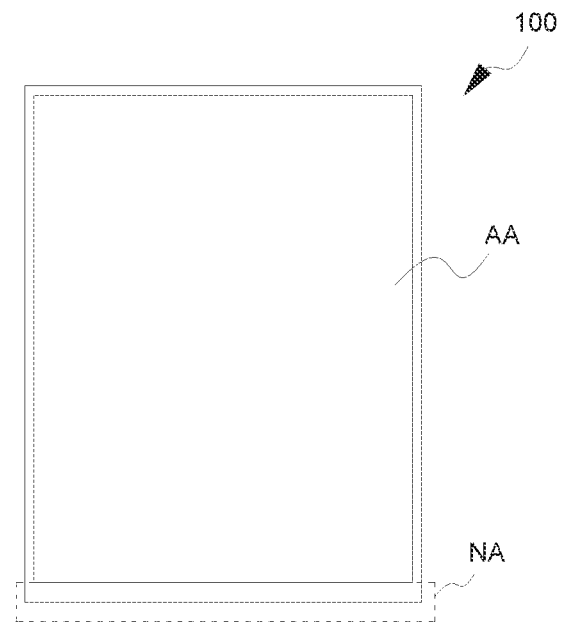
FIG. 1 is a schematic diagram of a front-view structure of a display panel according to an embodiment of the present application.

The technical solutions in the embodiments of the present application will be described clearly and completely with reference to the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

In the description of this application, it should be understood that the terms "portrait", "lateral", "length", "width", "upper", "lower", "front", "rear", "left", "right", "vertical", "horizontal", "top", "bottom", "inner", "outer", "clockwise", "counterclockwise" etc. indicated orientation or positional relationship is based on the orientation or positional relationship shown in the drawings, only to facilitate the description of this application and simplify the description, not to indicate or imply the device referred to Or the element must have a specific orientation, be constructed and operated in a specific orientation, and therefore cannot be understood as a limitation of the present application. In addition, the terms "first" and "second" are used for descriptive purposes only, and cannot be understood as indicating or implying relative importance or implicitly indicating the number of technical features indicated. Thus, the features defined as "first" and "second" may explicitly or implicitly include one or more of the features. In the description of this application, the meaning of "a plurality of" is two or more, unless otherwise specifically limited.

In the description of this application, it should be noted that, unless otherwise clearly specified and limited, the terms "installation", "connection", and "connection" should be understood in a broad sense, for example, it can be fixed connection or detachable Connected, or integrally connected; it can be mechanical, electrical, or can communicate with each other; it can be directly connected, or it can be indirectly connected through an intermediary, it can be the connection between two elements or the interaction of two elements relationship. Those of ordinary skill in the art can understand the specific meanings of the above terms in this application according to specific situations.

In this application, unless otherwise clearly specified and defined, the first feature "above" or "below" the second feature may include the direct contact of the first and second features, or may include the first and second features Not direct contact but contact through another feature between them. Moreover, the first feature is "above", "above" and "above" the second feature includes that the first feature is directly above and obliquely above the second feature, or simply means that the first feature is higher in level than the second feature. The first feature is "below", "below", and "below" the second feature includes that the first feature is directly below and obliquely below the second feature, or simply means that the first feature is less horizontal than the second feature.

The following disclosure provides many different embodiments or examples for implementing different structures of the present application. In order to simplify the disclosure of the present application, the components and settings of specific examples are described below. Of course, they are only examples, and the purpose is not to limit this application. In addition, the present application may repeat reference numerals and/or reference letters in different examples. Such repetition is for the purpose of simplicity and clarity, and does not itself indicate the relationship between the various embodiments and/or settings discussed. In addition, the present application provides examples of various specific processes and materials, but those of ordinary skill in the art may be aware of the application of other processes and/or the use of other materials.

Figure 2:
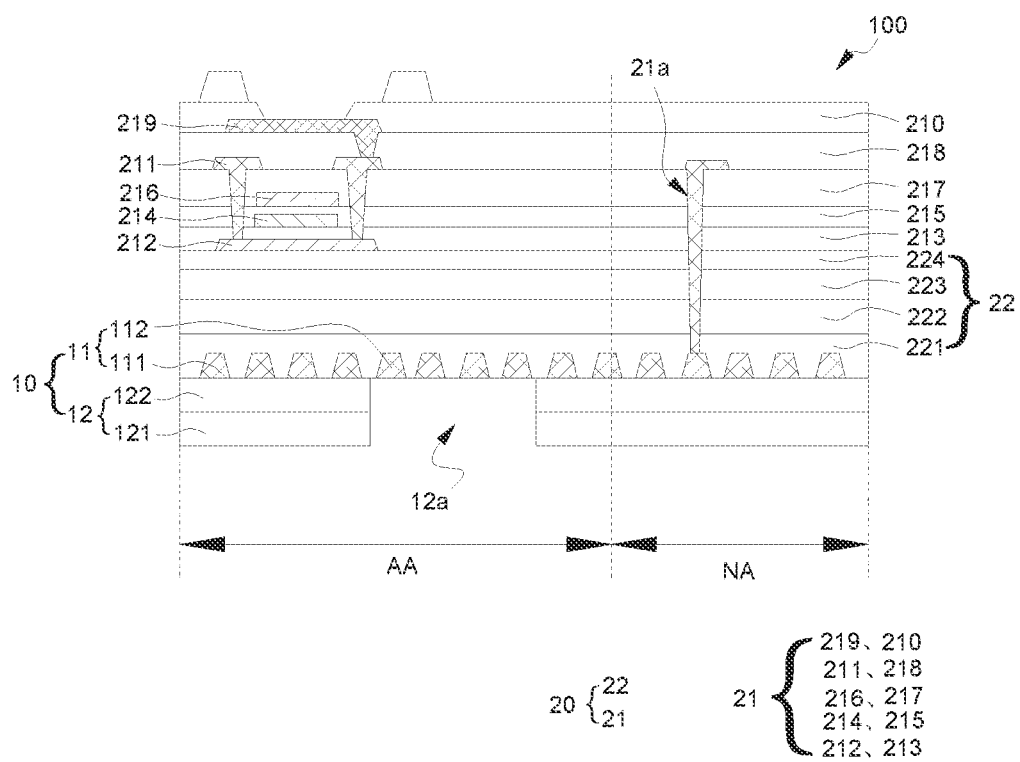
FIG. 2 is a schematic diagram of a cross-sectional structure of the display panel according to an embodiment of the present application.
Figure 3:
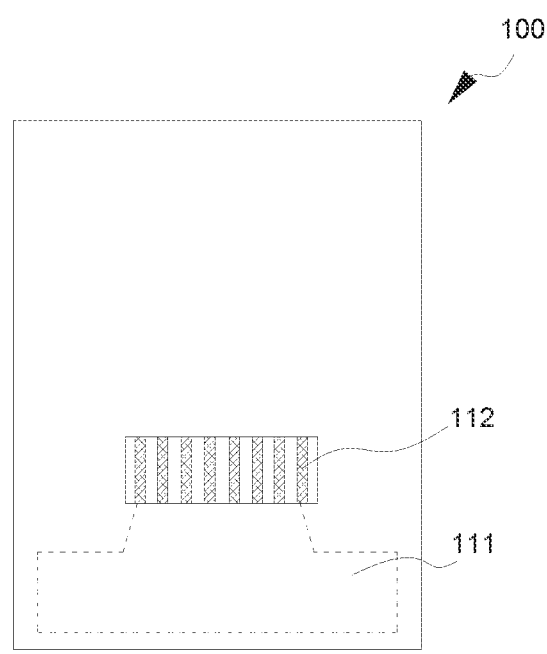
FIG. 3 is a schematic diagram of a rear-view structure of the display panel according to an embodiment of the present application.

Please refer to FIG. 1 to FIG. 3, FIG. 1 is a schematic diagram of a front view structure of a display panel according to an embodiment of the present application, FIG. 2 is a schematic diagram of a cross-sectional structure of the display panel according to an embodiment of the present application, and FIG. 3 is a schematic diagram of a rear-view structure of the display panel according to an embodiment of the present application.

An embodiment of the present application provides a display panel 100. The display panel 100 comprises a display area AA and an extension area NA outside the display area AA. The display panel 100 comprises a bonding module 10 and a display module 20. The bonding module 10 covers the display area AA and the extension area NA. The bonding module 10 comprises a bonding conductive layer 11 electrically connected to an external driving chip (not shown). The external driving chip is a component other than the display panel 100 of this embodiment.

The display module 20 covers the display area AA and the extension area NA. The display module 20 is disposed on the bonding module 10. The display module 20 comprises a thin film transistor array structure 21, and the thin film transistor array structure 21 comprises a source-drain conductive layer 211. A portion of the source-drain conductive layer 211 disposed in the extension region NA is electrically connected to the bonding conductive layer 11 by a through hole 21a.

In the display panel 100 of this embodiment, the bonding module 10 for bonding an external driving chip is disposed on a backside surface of the display module 20, and the source-drain conductive layer 211 in the display module 20 is electrically connected to the bonding conductive layer 11 by the through hole 21a, so that the display panel 100 saves a plane space for disposing the bonding module 10 and achieves effects of bezel narrowing.

Specifically, the bonding conductive layer 11 comprises a plurality of fan-out traces 111 and a plurality of bonding terminals 112. The plurality of fan-out traces 111 are electrically connected to the source-drain conductive layer 211. The bonding terminals 112 are connected to the fan-out traces 111 one by one, and the bonding terminals 112 are electrically connected to the external driving chip.

A material of the binding conductive layer 11 can be a pure metal, metal alloy, semiconductor material, or other material with conductive properties. Optionally, in this embodiment, the bonding conductive layer 11 is formed by a metal stack of multilayers.

In the display panel 100 of this embodiment, both the fan-out traces 111 and the bonding terminals 112 are provided on the backside surface of the display module 20, and a width of a lower bezel can be reduced when it is compared with that in the prior art.

Compared to a display panel that bends the bonding area toward the backside surface of the display module, the source-drain conductive layer 211 and the fan-out trace 111 in the display module 20 are connected by the through hole 21a, so that a width of a bending radius is reduced and a width of a lower bezel is further reduced. In addition, the connection method of using the through hole 21a is used to improve a stability of the electrical connection between the display module 20 and the bonding module 10. Compared with the existing display panel, the fan-out traces can be prevented from being damaged or even broken by bending stresses when being bent.

The source-drain conductive layer 211 comprises a source electrode, a drain electrode, a data line, and a driving line. The source electrode and the drain electrode are used to form a thin film transistor. One end of the driving line is connected to the data line, and the other end is connected to the fan-out trace 111.

In the display panel 100 of this embodiment, referring to FIGS. 2 and 3, the bonding module 10 further comprises a first substrate structure 12. The first substrate structure 12 is disposed on a side of the bonding conductive layer 11 facing away from the display module 20. An opening 12a is formed in the first substrate structure 12, and the opening 12a corresponds to a plurality of bonding terminals 112 so that the plurality of bonding terminals 112 are exposed.

The opening 12a is formed to expose the bonding terminals 112, so that the external driving chip is electrically connected to the bonding terminals 112. In this embodiment, the bonding terminals 112 are directly bound and connected to the external driving chip. In some embodiments, the bonding terminals 112 may also be bound and connected to terminals of a circuit board having the external driving chip.

In the display panel 100 of this embodiment, the first substrate structure 12 comprises the supporting layer 121 and the first flexible substrate 122. The first flexible substrate 122 is disposed between the supporting layer 121 and the bonding conductive layer 11. That is, the bonding module 10 comprises a supporting layer 121, a first flexible substrate 122 and a bonding conductive layer 11 which are sequentially disposed.

Specifically, both the first flexible substrate 122 and the supporting layer 121 are provided with a sub-opening, and these two sub-openings are overlapped and communicate with each other to form the opening 12a.

In the display panel 100 of this embodiment, the display module 20 further comprises a second substrate structure 22 disposed between the bonding module 10 and the thin film transistor array structure 21.

The thin film transistor array structure 21 further comprises an active layer 212, a first insulating layer 213, a first gate conductive layer 214, a second insulating layer 215, a second gate conductive layer 216, a dielectric layer 217, a planarization layer 218, an anode layer 219, and a pixel definition layer 210 sequentially disposed on the second substrate structure 22. The source-drain conductive layer 211 is disposed between the dielectric layer 217 and the planarization layer 218. It should be noted that the display panel 100 of this embodiment further comprises an organic light emitting structure and an encapsulation layer. Since the organic light-emitting structure and the encapsulation layer are existing technologies, they will not be described here.

The through hole 21a is formed in the extension area NA. The through hole 21a penetrates the dielectric layer 217, the second insulating layer 215, the first insulating layer 213, and the second substrate structure 22, and is connected to the fan-out traces 111.

In addition, the second substrate structure 22 comprises a first barrier layer 221, a second flexible substrate 222, a second barrier layer 223, and a buffer layer 224 that are sequentially disposed on the bonding conductive layer 11. In some embodiments, the second substrate structure 22 may also comprise a barrier layer and a buffer layer disposed on the bonding conductive layer 11. Of course, the second substrate structure 22 may also be other structures.

That is, in this embodiment, the display module 20 comprises a first barrier layer 221, a second flexible substrate 222, a second barrier layer 223, a buffer layer 224, an active layer 212, a first insulating layer 213, a first gate conductive layer 214, a second insulating layer 215, a second gate conductive layer 216, a dielectric layer 217, a source-drain conductive layer 211, a planarization layer 218, an anode layer 219, and a pixel definition layer 210 sequentially disposed on the bonding conductive layer 11.

Materials of the first gate conductive layer 214 and the second gate conductive layer 216 may be pure metals, metal alloys, semiconductor materials, or other conductive materials. Optionally, in this embodiment, the first gate conductive layer 214 and the second gate conductive layer 216 are respectively formed of a metal stack of multilayers.

Figure 4:
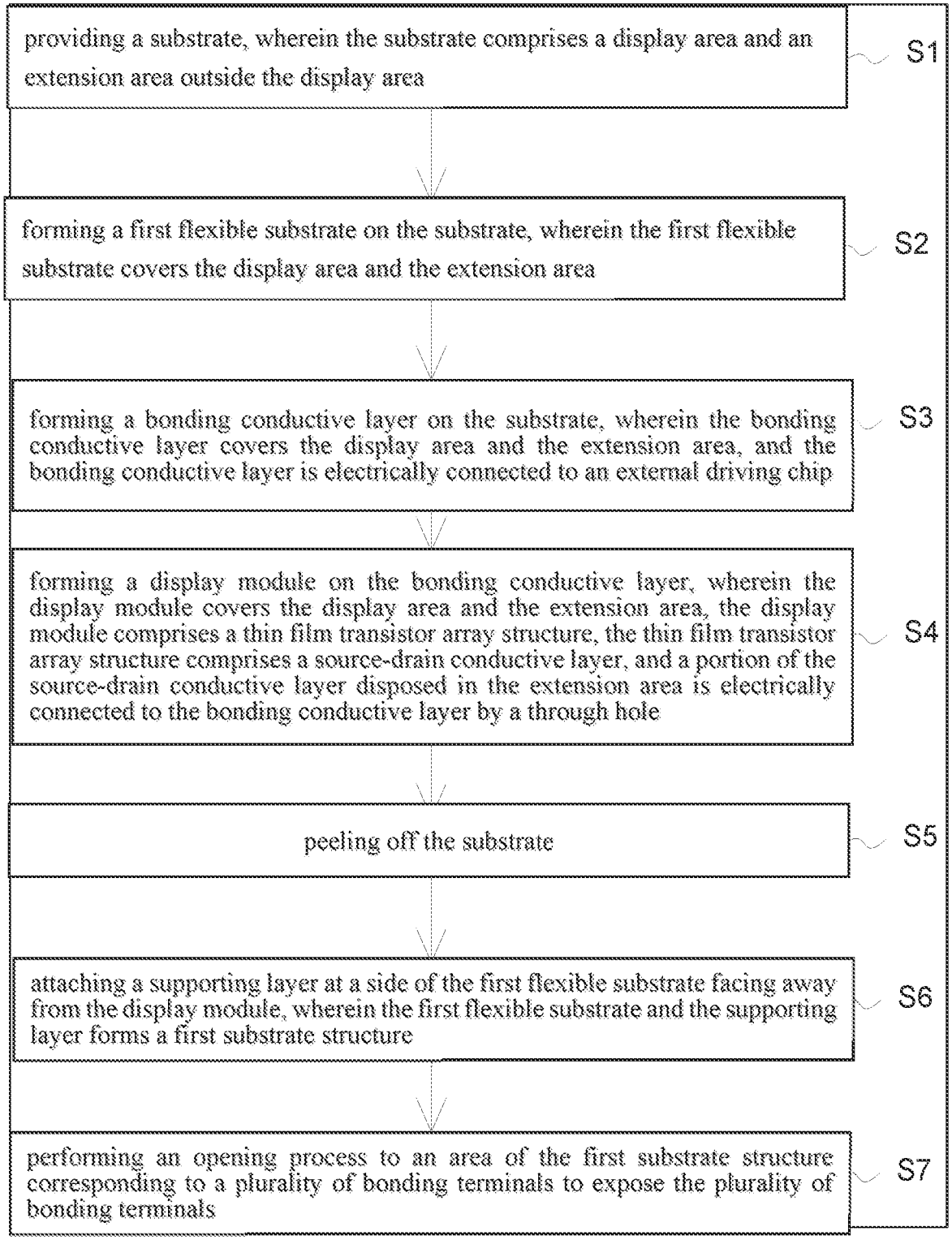
FIG. 4 is a flowchart of a fabrication method of a display panel according to an embodiment of the present application.

Please refer to FIG. 4, an embodiment of the present application also relates to a fabrication method of a display panel. The display panel is the display panel 100 of the above embodiment. For schematic diagrams of the display panel 100, please refer to FIG. 1 to FIG. 3. The fabrication method of the display panel comprises following steps:

Step S1: providing a substrate, wherein the substrate comprises a display area and an extension area outside the display area;

Step S2: forming a first flexible substrate on the substrate, wherein the first flexible substrate covers the display area and the extension area;

Step S3: forming a bonding conductive layer on the substrate, wherein the bonding conductive layer covers the display area and the extension area, and the bonding conductive layer is electrically connected to an external driving chip;

Step S4: forming a display module on the bonding conductive layer, wherein the display module covers the display area and the extension area, the display module comprises a thin film transistor array structure, the thin film transistor array structure comprises a source-drain conductive layer, and a portion of the source-drain conductive layer disposed in the extension area is electrically connected to the bonding conductive layer by a through hole;

Step S5: peeling off the substrate;

Step S6: attaching a supporting layer at a side of the first flexible substrate facing away from the display module, wherein the first flexible substrate and the supporting layer forms a first substrate structure;

Step S7: performing an opening process to an area of the first substrate structure corresponding to a plurality of bonding terminals to expose the plurality of bonding terminals.

The fabrication method of the display panel of this embodiment disposes a bonding module for bonding an external driving chip on a backside surface of the display module, and electrically connects a source-drain conductive layer in the display module to a bonding conductive layer of the bonding module through a through hole, thereby saving a plane space for disposing the bonding module and achieving effects of bezel narrowing.

The fabrication method of the display panel of this embodiment will now be described.

In the step S1, a substrate is provided. The substrate comprises a display area AA and an extension area NA outside the display area AA. The substrate is a rigid substrate, such as a glass substrate. The substrate is a carrier substrate for forming the display panel 100. Then go to step S2.

In step S2, a first flexible substrate 122 is formed on the substrate. The first flexible substrate 122 covers the display area AA and the extension area NA. A material of the first flexible substrate 122 may be polyimide. The function of the first flexible substrate 122 is to isolate the substrate from the subsequently formed film layers and to prevent damages to subsequently formed film layers when the substrate is peeled off, and to enhance the performance for preventing entry of moistures. Then go to step S3.

In step S3, the bonding conductive layer 11 is formed on the substrate. The bonding conductive layer 11 covers the display area AA and the extension area NA. The bonding conductive layer 11 is electrically connected to the external driving chip. It should be noted that the external driver chip is a component other than the display panel of this embodiment.

Specifically, the bonding conductive layer 11 comprises a plurality fan-out traces 111 and a plurality of bonding terminals 112. The plurality of fan-out traces 111 are electrically connected to the source-drain conductive layer 211 that are formed later. The bonding terminals 112 are connected to the fan-out traces 111 one by one. The bonding terminals 112 are electrically connected to the external driving chip.

A material of the bonding conductive layer 11 can be a pure metal, metal alloy, semiconductor material, or other material with conductive properties. Optionally, in this embodiment, the bonding conductive layer 11 is formed by a metal stack of multilayers.

The fan-out traces 111 and the bonding terminal 112 are both disposed on the backside surface of the display module 20 that is formed later, and compared with the prior art, a width of a lower bezel is reduced. Then go to step S4.

In step S4, the display module 20 is formed on the bonding conductive layer 11. The display module 20 covers the display area AA and the extension area NA. The display module 20 comprises a thin film transistor array structure 21. The thin film transistor array structure 21 comprises a source-drain conductive layer 211. The portion of the source-drain conductive layer 211 disposed in the extension region NA is electrically connected to the bonding conductive layer 11 by the through hole 21a.

Figure 5:
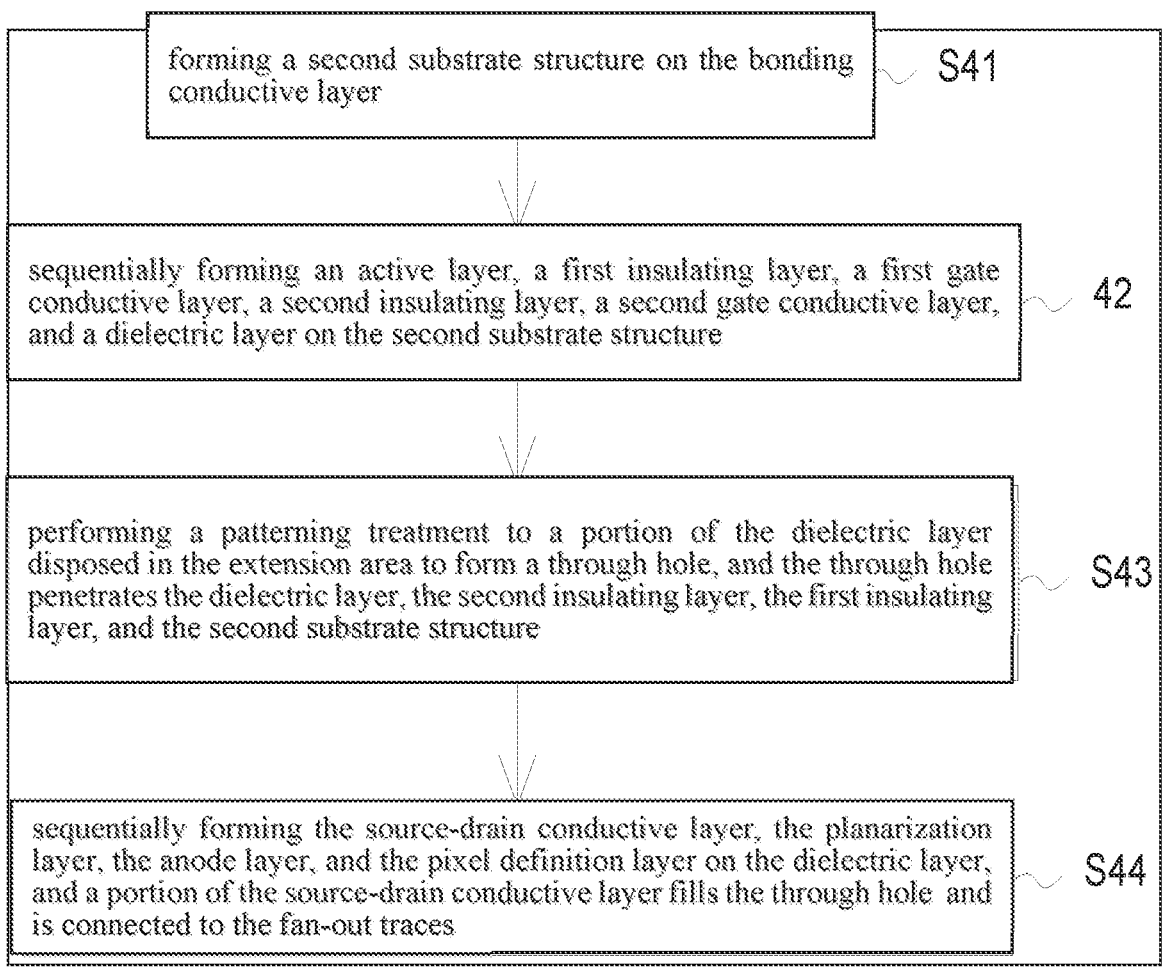
FIG. 5 is a flowchart of a step S4 of the fabrication method of the display panel according to an embodiment of the present application.

Specifically, referring to FIG. 5, step S4 further comprises following steps:

S41: forming a second substrate structure 22 on the bonding conductive layer 11;

S42: sequentially forming an active layer 212, a first insulating layer 213, a first gate conductive layer 214, a second insulating layer 215, a second gate conductive layer 216, and a dielectric layer 217 on the second substrate structure 22;

S43: performing a patterning treatment to a portion of the dielectric layer 217 disposed in the extension area NA to form the through hole 21a, and the through hole 21a penetrates the dielectric layer 217, the second insulating layer 215, the first insulating layer 213, and the second substrate structure 22;

S44: sequentially forming the source-drain conductive layer 211, the planarization layer 218, the anode layer 219, and the pixel definition layer 210 on the dielectric layer 217. A portion of the source-drain conductive layer 211 fills the through hole 21a and is connected to the fan-out traces 111.

In step S41, the second substrate structure 22 is formed on the bonding conductive layer 11. Specifically, step S41 sequentially forms a first barrier layer 221, a second flexible substrate 222, a second barrier layer 223, and a buffer layer 224 on the bonding conductive layer 11. The first barrier layer 221 has a certain leveling property to provide a planarized film surface for subsequent film layers. In addition, both the first barrier layer 221 and the second barrier layer 223 have the property of blocking moistures from entering the thin film transistor array structure 21. Then go to step S42.

In step S42, the active layer 212, the first insulating layer 213, the first gate conductive layer 214, the second insulating layer 215, the second gate conductive layer 216, and the dielectric layer 217 are sequentially formed on the second substrate structure 22. Materials of the first gate conductive layer 214 and the second gate conductive layer 216 may be pure metals, metal alloys, semiconductor materials, or other conductive materials. Optionally, in this embodiment, the first gate conductive layer 214 and the second gate conductive layer 216 are respectively formed of metal stacks of multiple layers. Then go to step S43.

In step S43, the portion of the dielectric layer 217 disposed in the extension area NA is patterned to form the through hole 21a, and the through hole 21a penetrates the dielectric layer 217, the second insulating layer 215, the first insulating layer 213, and the second substrate structure 22.

Specifically, a photolithography process is used to expose and develop the dielectric layer 217, and a plurality of through holes 21a are formed in the extension area NA at positions corresponding to the fan-out traces 111. Subsequently, a through-hole etching which may be dry etching, wet etching, or laser etching is performed on the through holes 21a. Finally, the through hole 21a penetrates the dielectric layer 217, the second insulating layer 215, the first insulating layer 213, and the second substrate structure 22, and the fan-out traces 111 are exposed. Then go to step S44.

In step S44, the source-drain conductive layer 211, the planarization layer 218, the anode layer 219, and the pixel definition layer 210 are sequentially formed on the dielectric layer 217. A portion of the source-drain conductive layer 211 fills the through hole 21a and is connected to the fan-out trace 111.

It should be noted that, in step S44, it also includes the process of forming other film layers and modules such as an organic light-emitting structure and an encapsulation layer on the pixel definition layer 210. Since other film layers and module fabrications are prior art, they will not be repeated here.

In addition, when forming the source-drain conductive layer 211, the material of the source-drain conductive layer is deposited in the through hole 21a, so that the leads of the source-drain conductive layer 211 in the extension area NA are connected to the fan-out traces 111.

The display module 20 comprises the second substrate structure 22 and a thin film transistor array structure 21. Compared to a display panel that bends the bonding area toward the backside surface of the display module, the source-drain conductive layer 211 and the fan-out trace 111 in the display module 20 are connected by the through hole 21a, so that a width of a bending radius is reduced and a width of a lower bezel is further reduced. In addition, the connection method of using the through hole 21a is used to improve a stability of the electrical connection between the display module 20 and the bonding module 10. Compared with the existing display panel, the fan-out traces can be prevented from being damaged or even broken by bending stresses when being bent.

Then go to step S5.

In step S5, peeling off the substrate. Specifically, laser is used to peel off the substrate. Then go to step S6.

In step S6, a supporting layer 121 is attached to a side of the first flexible substrate 122 facing away from the display module 20, and the first flexible substrate 122 and the supporting layer 121 form the first substrate structure 12. At this time, the first substrate structure 12 and the bonding conductive layer 11 form a bonding module 10. Then go to step S7.

In step S7, an opening process is performed to an area of the first substrate structure 12 corresponding to the plurality of bonding terminals 112 to form an opening 12a to expose the plurality of bonding terminals 112. Exposing the bonding terminal 112 facilitates the electrical connection between the external driving chip and the bonding terminal 112.

This completes the manufacturing processes of the display panel 100 of this embodiment.

In the display panel of the present application, a bonding module for bonding an external driving chip is disposed on a backside surface of the display module, and a source-drain conductive layer in the display module is electrically connected to a bonding conductive layer of the bonding module through a through hole, thereby saving a plane space for disposing the bonding module and achieving effects of bezel narrowing.

The descriptions of the above embodiments are only used to help understand the technology of the present application, solutions and their core ideas; those of ordinary skill in the art should understand that they can still modify the technical solutions described in the foregoing embodiments or equivalently replace some of the technical features, and these modifications or replacements do not make the essence of the corresponding technical solutions deviate from the scope of the technical solutions of the embodiments of the present application.

What is claimed is:

1. A display panel including a display area and an extension area outside the display area, comprising:
   a bonding module covering the display area and the extension area, wherein the bonding module comprises a bonding conductive layer, and the bonding conductive layer is electrically connected to an external driving chip; and
   a display module covering the display area and the extension area, wherein the display module is disposed on the bonding module, the display module comprises a thin film transistor array structure, and the thin film transistor array structure comprises a source-drain conductive layer, wherein:
   a portion of the source-drain conductive layer in the extension area is electrically connected to the bonding conductive layer by a through hole;
   the bonding conductive layer comprises a plurality of fan-out traces and a plurality of bonding terminals, the plurality of fan-out traces are electrically connected to the source-drain conductive layer, the bonding terminals are connected to the fan-out traces one by one, and the bonding terminals are electrically connected to the external driving chip; and
   a material of the bonding conductive layer is a pure metal, metal alloy, or semiconductor material;
   wherein the bonding module further comprises a first substrate structure, the first substrate structure is disposed on the bonding conductive layer at a side away from the display module, an opening is formed in the first substrate structure, and the opening corresponds to the plurality of bonding terminals and exposes the plurality of bonding terminals.

2. The display panel according to claim 1, wherein the first substrate structure comprises a support layer and a first flexible substrate, and the first flexible substrate is disposed between the support layer and the bonding conductive layer.

3. The display panel of claim 2, wherein the display module further comprises a second substrate structure, and the second substrate structure is disposed between the bonding module and the thin film transistor array structure,
   wherein the thin film transistor array structure further comprises an active layer, a first insulating layer, a first gate conductive layer, a second insulating layer, a second gate conductive layer, a dielectric layer, and a planarization layer sequentially disposed on the second substrate structure, and the source-drain conductive layer is disposed between the dielectric layer and the planarization layer; and
   the through hole is formed in the extension area and penetrates the dielectric layer, the second insulating layer, the first insulating layer, and the second substrate structure, and is connected to the fan-out traces.

4. The display panel of claim 3, wherein the second substrate structure comprises a first barrier layer, a second flexible substrate, a second barrier layer, and a buffer layer sequentially disposed on the bonding conductive layer.

5. A display panel including a display area and an extension area outside the display area, comprising:
- a bonding module covering the display area and the extension area, wherein the bonding module comprises a bonding conductive layer, and the bonding conductive layer is electrically connected to an external driving chip; and
- a display module covering the display area and the extension area, wherein the display module is disposed on the bonding module, the display module comprises a thin film transistor array structure, and the thin film transistor array structure comprises a source-drain conductive layer,
- wherein a portion of the source-drain conductive layer in the extension area is electrically connected to the bonding conductive layer by a through hole;
- wherein the bonding conductive layer comprises a plurality of fan-out traces and a plurality of bonding terminals, the plurality of fan-out traces are electrically connected to the source-drain conductive layer, the bonding terminals are connected to the fan-out traces one by one, and the bonding terminals are electrically connected to the external driving chip;
- wherein the bonding module further comprises a first substrate structure, the first substrate structure is disposed on the bonding conductive layer at a side away from the display module, an opening is formed in the first substrate structure, and the opening corresponds to the plurality of bonding terminals and exposes the plurality of bonding terminals.

6. The display panel according to claim 5, wherein the first substrate structure comprises a support layer and a first flexible substrate, and the first flexible substrate is disposed between the support layer and the bonding conductive layer.

7. The display panel according to claim 6, wherein the display module further comprises a second substrate structure, and the second substrate structure is disposed between the bonding module and the thin film transistor array structure,
- wherein the thin film transistor array structure further comprises an active layer, a first insulating layer, a first gate conductive layer, a second insulating layer, a second gate conductive layer, a dielectric layer, and a planarization layer sequentially disposed on the second substrate structure, and the source-drain conductive layer is disposed between the dielectric layer and the planarization layer; and
- the through hole is formed in the extension area and penetrates the dielectric layer, the second insulating layer, the first insulating layer, and the second substrate structure, and is connected to the fan-out traces.

8. The display panel of claim 7, wherein the second substrate structure comprises a first barrier layer, a second flexible substrate, a second barrier layer, and a buffer layer sequentially disposed on the bonding conductive layer.

9. A fabrication method of a display panel, comprising following steps:
- providing a substrate, wherein the substrate comprises a display area and an extension area outside the display area;
- forming a bonding conductive layer on the substrate, wherein the bonding conductive layer covers the display area and the extension area, and the bonding conductive layer is electrically connected to an external driving chip; and
- forming a display module on the bonding conductive layer, wherein the display module covers the display area and the extension area, the display module comprises a thin film transistor array structure, the thin film transistor array structure comprises a source-drain conductive layer, and a portion of the source-drain conductive layer in the extension area is electrically connected to the bonding conductive layer through a through hole;
- wherein the bonding conductive layer comprises a plurality of fan-out traces and a plurality of bonding terminals, the plurality of fan-out traces are electrically connected to the source-drain conductive layer, the bonding terminals are connected to the fan-out traces one by one, and the bonding terminals are electrically connected to the external driving chip;
- wherein prior to forming of the bonding conductive layer on the substrate, further comprises a step of forming a first flexible substrate on the substrate; and
- prior to forming the display module on the bonding conductive layer, further comprises following steps:
- peeling off the substrate;
- adhering a support layer at a side of the first flexible substrate facing away from the display module, wherein the first flexible substrate and the support layer form a first substrate structure; and
- performing an opening process to an area of the first substrate structure corresponding to the plurality of bonding terminals to expose the plurality of bonding terminals.

10. The fabrication method according to claim 9, wherein forming the display module on the bonding conductive layer comprises following steps:
- forming a second substrate structure on the bonding conductive layer;
- sequentially forming an active layer, a first insulating layer, a first gate conductive layer, a second insulating layer, a second gate conductive layer, and a dielectric layer on the second substrate structure;
- performing a patterning treatment to a portion of the dielectric layer disposed in the extension area to form the through hole, and the through hole penetrates the dielectric layer, the second insulating layer, the first insulating layer, and the second substrate structure; and
- sequentially forming the source-drain conductive layer and a planarization layer on the dielectric layer, wherein a portion of the source-drain conductive layer fills the through hole and is connected to the fan-out traces.

* * * * *